US011802893B2

(12) United States Patent
Chou et al.

(10) Patent No.: US 11,802,893 B2
(45) Date of Patent: Oct. 31, 2023

(54) CONTROL MODULE OF POWER CALIBRATION CIRCUIT

(71) Applicant: SEA SONIC ELECTRONICS CO., LTD., Taipei (TW)

(72) Inventors: Sheng-Chien Chou, Taipei (TW); Chien-Chung Tsan, Taipei (TW)

(73) Assignee: SEA SONIC ELECTRONICS CO., LTD., Taipei (TW)

( * ) Notice: Subject to any disclaimer, the term of this patent is extended or adjusted under 35 U.S.C. 154(b) by 75 days.

(21) Appl. No.: 17/526,438

(22) Filed: Nov. 15, 2021

(65) Prior Publication Data

US 2023/0152357 A1    May 18, 2023

(51) Int. Cl.
*G01R 22/06*    (2006.01)
*G01R 35/00*    (2006.01)

(52) U.S. Cl.
CPC ............ *G01R 22/06* (2013.01); *G01R 35/00* (2013.01)

(58) Field of Classification Search
CPC ................................ G01R 22/06; G01R 35/00
USPC .......................................................... 702/60
See application file for complete search history.

(56) References Cited

U.S. PATENT DOCUMENTS

| 8,400,165 | B2* | 3/2013 | Reichel | G01R 35/005 |
| | | | | 702/85 |
| 2011/0187345 | A1* | 8/2011 | Karnik | G01R 35/00 |
| | | | | 324/74 |
| 2013/0241506 | A1* | 9/2013 | Yang | G05F 1/62 |
| | | | | 323/282 |
| 2020/0408867 | A1* | 12/2020 | Ishikawa | H02P 29/024 |
| 2022/0035392 | A1* | 2/2022 | Kazarians | G05F 1/575 |

* cited by examiner

*Primary Examiner* — Ricky Go
(74) *Attorney, Agent, or Firm* — Muncy, Geissler, Olds & Lowe, P.C.

(57) ABSTRACT

A control module of a power calibration circuit comprises a control unit, a main voltage feedback unit and an auxiliary voltage feedback unit, the control unit is connected to at least one power switch, the main voltage feedback unit is connected to an output terminal of the power calibration circuit and the control unit, the auxiliary voltage feedback unit is connected to the output terminal and the control unit, the auxiliary voltage feedback unit comprises a voltage dividing circuit connected to the output terminal and having at least one voltage dividing node, and a voltage limiting circuit connected to the voltage dividing node and the control unit, the voltage limiting circuit has a first state when a voltage of the voltage dividing node is not higher than a reference voltage, and a second state when a voltage of the voltage dividing node is higher than the reference voltage.

15 Claims, 6 Drawing Sheets

CONTROL MODULE OF POWER CALIBRATION CIRCUIT

FIELD OF THE INVENTION

The invention relates to a control module of a power calibration circuit, and more particularly to a control module of a power calibration circuit capable of clamping a feedback voltage.

BACKGROUND OF THE INVENTION

The conventional control module of a power calibration circuit has a feedback control mechanism to calibrate the current control based on the voltage of the output terminal of the power calibration circuit.

Specifically, the voltage of the output terminal of the power calibration circuit varies with the post load. In other words, the higher the demand of the post load, the higher the electric energy provided by the power calibration circuit. However, the post load of the power calibration circuit does not always remain constant. If the voltage of the post load drops suddenly, the voltage of the output terminal of the power calibration circuit has to increase significantly to perform a feedback mechanism that causes the control module to perform appropriate control for the reduction. Accordingly, a problem of delay in response in which the power calibration circuit will continue to output at a higher voltage for a period of time occurred. For a high-voltage capacitor installed at the post load of the power calibration circuit, the high-voltage capacitor needs to withstand a higher voltage during that period of time, and excessive voltage will put the high-voltage capacitor in a dangerous environment.

In order to solve this problem, some manufacturers use capacitors that withstand higher voltage, but the problem that follows is the increase in cost.

SUMMARY OF THE INVENTION

A main object of the invention is to solve the problem of feedback response of the conventional power calibration circuit being too slow, resulting in ineffective protection of the post-stage coordinative circuits.

In order to achieve the above object, the invention provides a control module of a power calibration circuit comprising a control unit, a main voltage feedback unit and an auxiliary voltage feedback unit. The control unit is connected to at least one power switch of the power calibration circuit, the main voltage feedback unit is connected to an output terminal of the power calibration circuit and the control unit, and the auxiliary voltage feedback unit is connected to the output terminal of the power calibration circuit and the control unit. The auxiliary voltage feedback unit comprises a voltage dividing circuit which is connected to the output terminal and includes at least one voltage dividing node, and a voltage limiting circuit which is connected to the at least one voltage dividing node and the control unit. If a voltage of the at least one voltage dividing node is not higher than a reference voltage, the voltage limiting circuit is in a first state without interfering a feedback voltage provided from the main voltage feedback unit to the control unit, and if the voltage of the at least one voltage dividing node is higher than the reference voltage, the voltage limiting circuit is in a second state that interferes the feedback voltage provided from the main voltage feedback unit to the control unit with an interference voltage.

In one embodiment, the voltage limiting circuit comprises a comparator and a diode connected to the comparator. The comparator comprises a non-inverting input terminal connected to the at least one voltage dividing node, an inverting input terminal receiving the reference voltage, and an output terminal. The diode comprises a positive electrode connected to the output terminal of the comparator, and a negative electrode connected to the control unit.

In one embodiment, the voltage limiting circuit comprises a first resistor and a first capacitor connected in series with the first resistor. A first series node formed between the first resistor and the first capacitor is connected to the output terminal of the comparator, and one end of the first resistor not connected in series with the first capacitor is connected to an operating voltage source.

In one embodiment, the voltage limiting circuit comprises a second resistor connected to the negative electrode of the diode.

In one embodiment, the voltage limiting circuit comprises a reference voltage generating circuit to generate the reference voltage. The reference voltage generating circuit comprises a third resistor connected to an operating voltage source, a three-terminal adjustable shunt reference source connected in series with the third resistor to form a second series node therebetween, a voltage dividing bypass connected in parallel with the three-terminal adjustable shunt reference source, and a second capacitor connected in parallel with the three-terminal adjustable shunt reference source and the voltage dividing bypass. The voltage dividing bypass comprises at least two divider resistors and at least one bypass node formed between the divider resistors. The three-terminal adjustable shunt reference source comprises a reference terminal connected to the at least one bypass node, and a voltage value of the second series node is defined as the reference voltage.

In one embodiment, the reference voltage is generated by the comparator.

In one embodiment, the power calibration circuit is a bridge-type power calibration circuit.

In one embodiment, the power calibration circuit is a bridgeless-type power calibration circuit.

Accordingly, compared with conventional technique, the invention comprises the following features: by further comprising the auxiliary voltage feedback unit in addition to the main voltage feedback unit, the invention interferes the feedback voltage received by the control unit when the voltage of the output terminal of the power calibration circuit rises to trigger a condition of the second state. The control unit is capable of performing responded control in advance to prevent the post-stage circuits such as high-voltage capacitor from withstanding excessive voltage, so that the post-stage circuits is effectively protected.

DETAILED DESCRIPTION OF THE PREFERRED EMBODIMENTS

The detailed description and technical content of the invention are described below with reference to the accompanying drawings.

Figure 1:
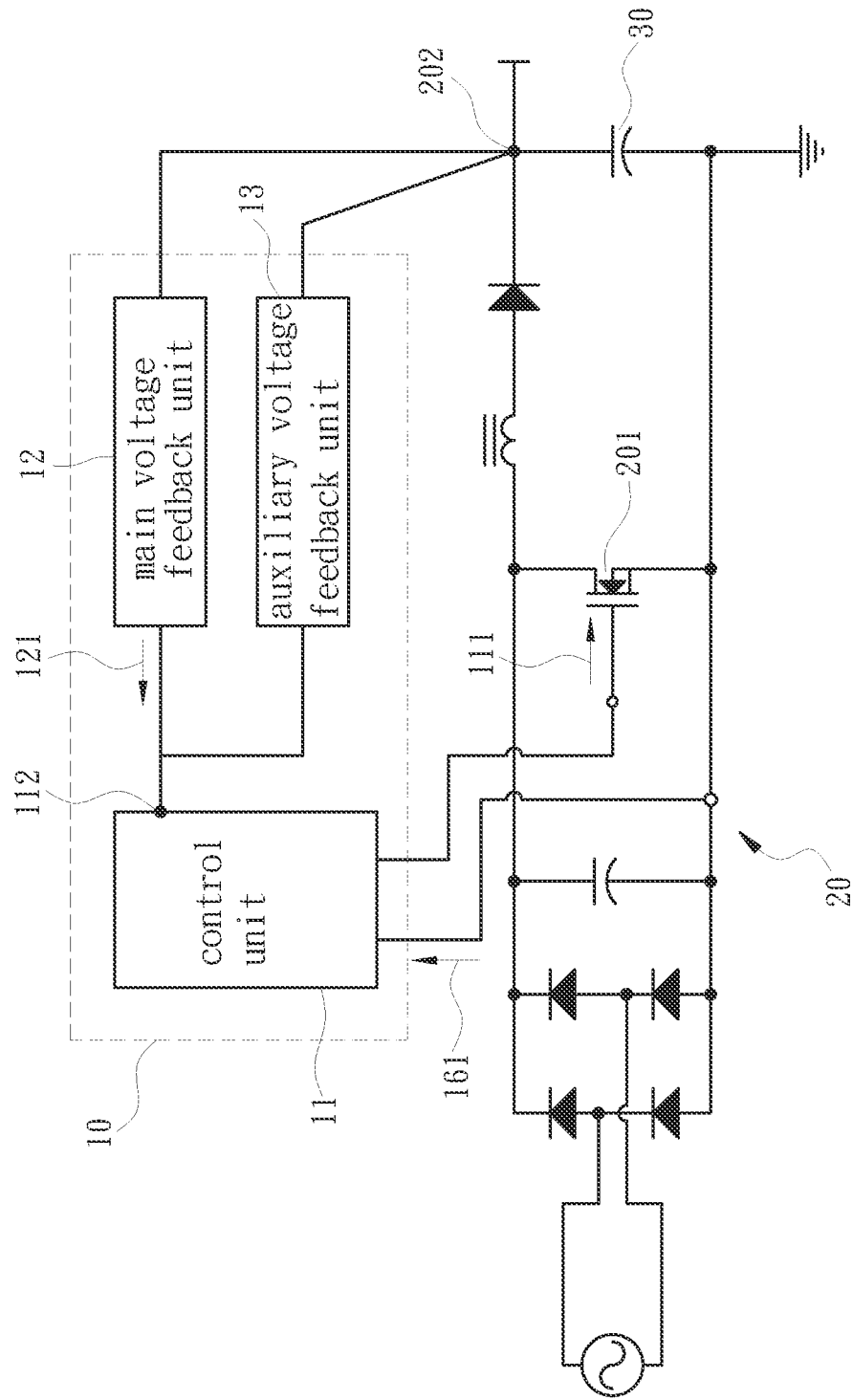
FIG. 1 is a first schematic diagram of implementation of a control module of a power calibration circuit of the invention.
Figure 2:
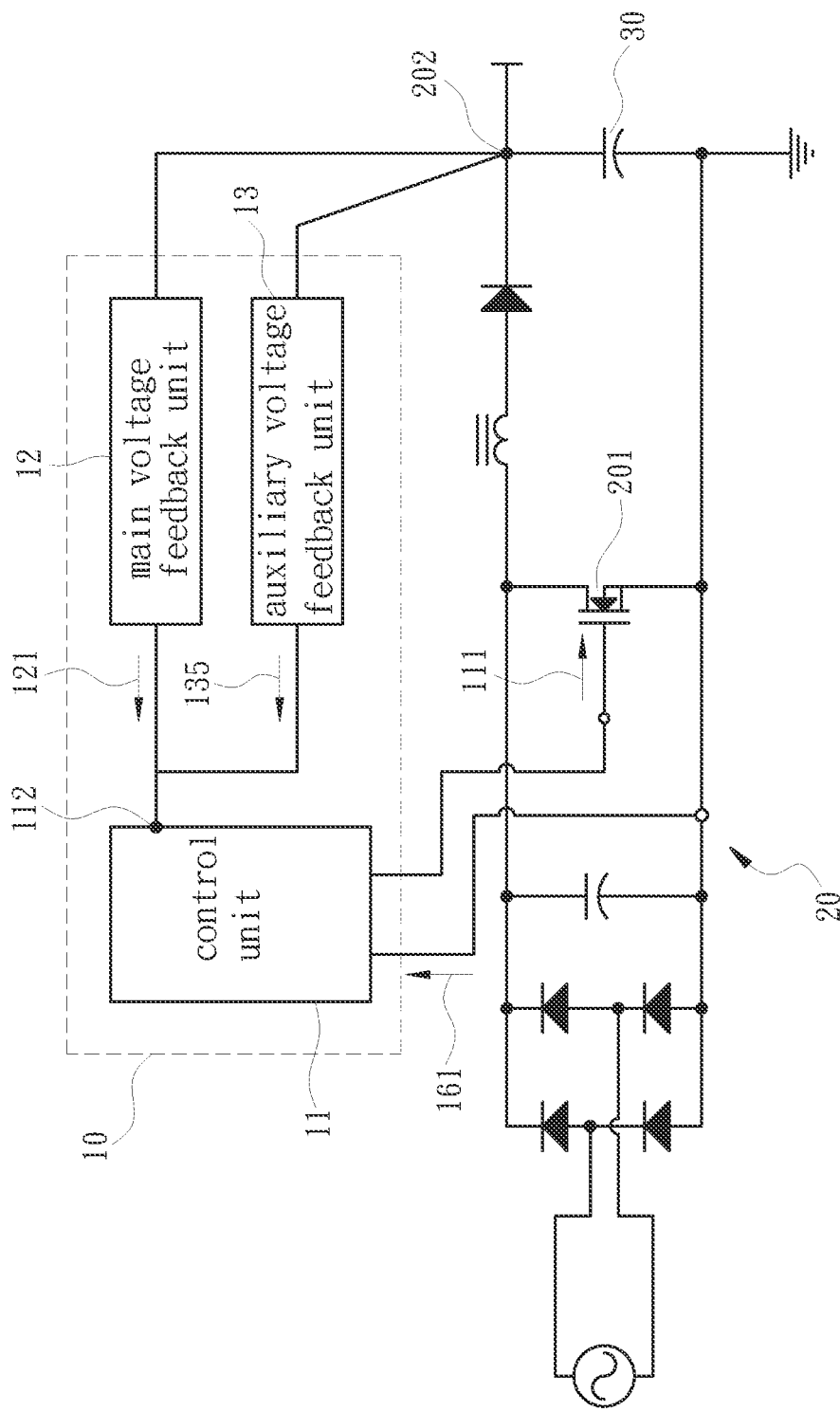
FIG. 2 is a second schematic diagram of implementation of the control module of the power calibration circuit of the invention.
Figure 3:
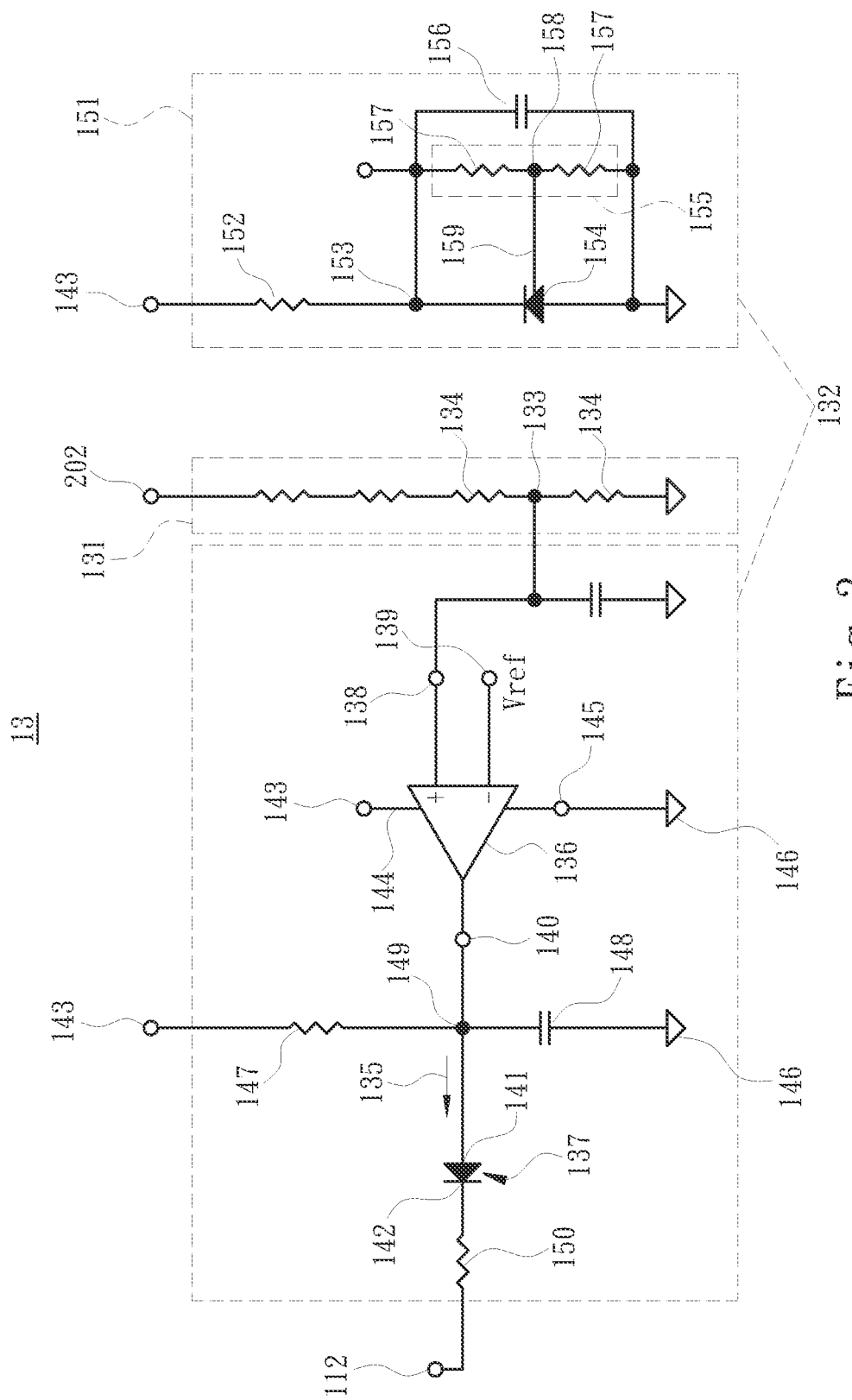
FIG. 3 is a circuit diagram of a first embodiment of an auxiliary voltage feedback unit of the invention.
Figure 5:
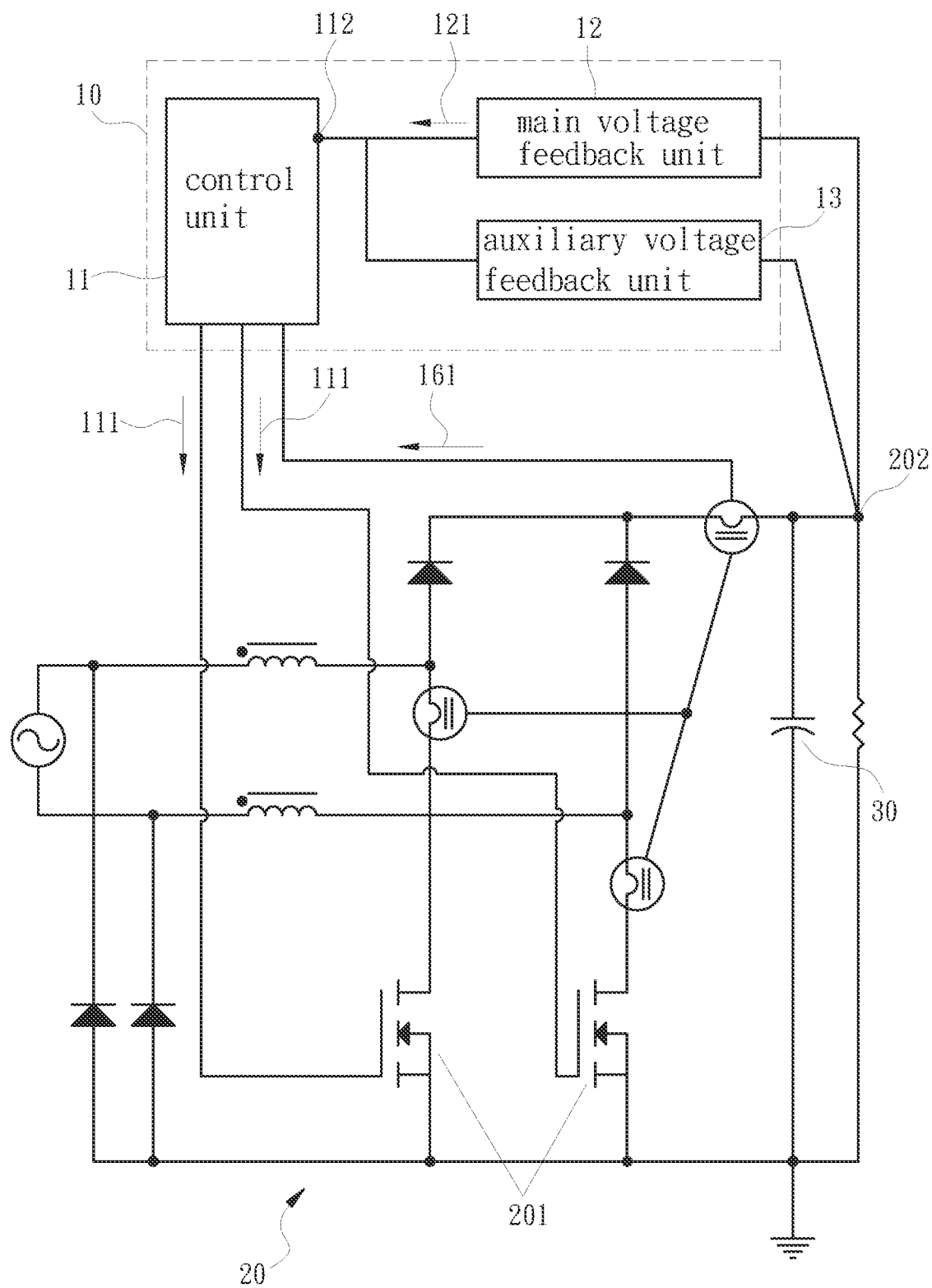
FIG. 5 is a third schematic diagram of implementation of the control module of the power calibration circuit of the invention.
Figure 6:
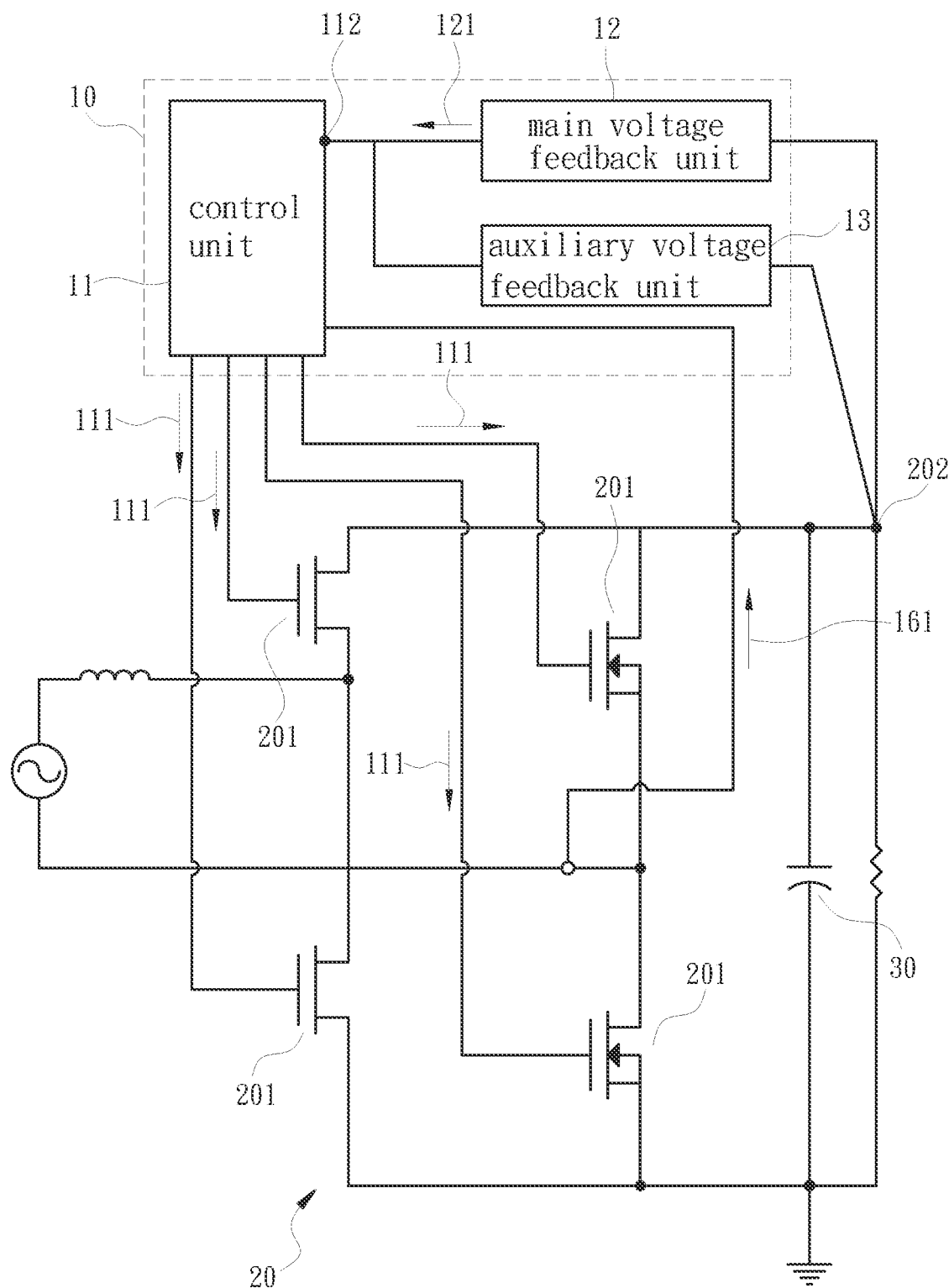
FIG. 6 is a fourth schematic diagram of implementation of the control module of the power calibration circuit of the invention.

Please refer to FIG. 1, FIG. 2 and FIG. 3. The invention provides a control module 10 which controls the operation of a power calibration circuit 20. Any type of power calibration circuit that is capable of performing feedback control can be applied in the invention, for example, FIG. 1 and FIG. 2 are implementations of a bridge-type power calibration circuit, and FIG. 5 and FIG. 6 are implementations of a bridgeless-type power calibration circuit. Please refer to FIG. 1, FIG. 2 and FIG. 3. The control module 10 of the invention comprises a control unit 11, a main voltage feedback unit 12, and an auxiliary voltage feedback unit 13. The control unit 11 is connected to at least one power switch 201 of the power calibration circuit 20. The control unit 11 determines to provide an on-off signal 111 to the power switch 201 based on a feedback voltage 121 and a feedback current signal 161. The feedback voltage 121 is given by the main voltage feedback unit 12 and the auxiliary voltage feedback unit 13. The feedback current signal 161 is obtained from the power calibration circuit 20. The operation of the power switch 201 is determined by the on-off signal 111. In one embodiment, the control unit 11 is a chip and a plurality of electronic components implemented with the chip.

On the other hand, the main voltage feedback unit 12 is connected to an output terminal 202 of the power calibration circuit 20 and the control unit 11. In one embodiment, the main voltage feedback unit 12 is a feedback circuit commonly used for feedback control of the power calibration circuit 20. The main voltage feedback unit 12 is an important part of the control unit 11 to implement feedback control, the main voltage feedback unit 12 does not change in status, and after the power calibration circuit 20 is started, the feedback voltage 121 is provided to the control unit 11.

Furthermore, both the auxiliary voltage feedback unit 13 and the main voltage feedback unit 12 are connected to a feedback input terminal 112 of the control unit 11. The auxiliary voltage feedback unit 13 comprises a voltage dividing circuit 131 and a voltage limiting circuit 132. The voltage dividing circuit 131 is connected to the output terminal 202 and includes at least one voltage dividing node 133. Moreover, the voltage dividing circuit 131 comprises at least two resistors 134 connected in series. Furthermore, the voltage limiting circuit 132 is connected to the at least one voltage dividing node 133 and the control unit 11. If a voltage of the at least one voltage dividing node 133 is not higher than a reference voltage (Vref), the voltage limiting circuit 132 is in a first state without interfering the feedback voltage 121 provided from the main voltage feedback unit 12 to the control unit 11. If a voltage of the at least one voltage dividing node 133 is higher than the reference voltage (Vref), the voltage limiting circuit 132 is in a second state that interferes the feedback voltage 121 provided from the main voltage feedback unit 12 to the control unit 11 with an interference voltage 135.

Accordingly, the auxiliary voltage feedback unit 13 of the invention only acts on the control unit 11 when certain conditions are met; in the rest of the time, the auxiliary voltage feedback unit 13 will not interfere with the feedback voltage 121 provided from the main voltage feedback unit 12 to the feedback input terminal 112. Furthermore, since a voltage of the output terminal 202 of the power calibration circuit 20 is not a fixed value, the voltage of the output terminal 202 varies with a load of the power calibration circuit 20, which means that a voltage of the voltage dividing node 133 will change accordingly. Please refer to FIG. 1, when a voltage of the voltage dividing node 133 is lower than the reference voltage (Vref), the auxiliary voltage feedback unit 13 is in the first state, and the voltage limiting circuit 132 does not provide any voltage for feedback control to the feedback input terminal 112 of the control unit 11. Please refer to FIG. 3, when a voltage of the voltage dividing node 133 is higher than the reference voltage (Vref), the auxiliary voltage feedback unit 13 is in the second state, and the voltage limiting circuit 132 outputs the interference voltage 135, to the control unit 11 to interfere with the feedback voltage 121 provided by the main voltage feedback unit 12 to the control unit 11, so that the control unit 11 modulates the on-off signal 111 based on a voltage value after interference of the interference voltage 135. The interference voltage 135 can be regarded as another feedback voltage. In this way, the invention solves the problems that the post-stage circuits, such as a high-voltage capacitor 30, need to be designed with high voltage since the feedback response of the power calibration circuit 20 is too slow. In other words, by disposition of the auxiliary voltage feedback unit 13, the post-stage circuits of the power calibration circuit 20 are effectively protected without withstanding excessive voltage.

Since the output terminal 202 of the power calibration circuit 20 has a relatively high voltage, the output terminal 202 is difficult to be directly used for feedback control. In conventional technique, a voltage of the output terminal 202 is divided by the voltage dividing circuit 131 as described above to obtain a voltage that is more suitable for work. However, when the invention is implemented, the auxiliary voltage feedback unit 13 does not share the voltage dividing circuit 131 with the main voltage feedback unit 12, and the main voltage feedback unit 12 is implemented with another voltage dividing circuit (not shown in the figures).

Please refer to FIG. 3. In one embodiment, the voltage limiting circuit 132 comprises a comparator 136 and a diode 137 connected to the comparator 136. The comparator 136 comprises a non-inverting input terminal 138 connected to the voltage dividing node 133, an inverting input terminal 139 receiving the reference voltage (Vref), and an output terminal 140 connected to the diode 137. The diode 137 is used to isolate the main voltage feedback unit 12 and the auxiliary voltage feedback unit 13. The diode 137 comprises a positive electrode 141 connected to the output terminal 140, and a negative electrode 142 connected to the control unit 11. In one embodiment, the comparator 136 comprises a positive power terminal 144 connected to an operating voltage source 143, and a negative power terminal 145 connected to a ground reference point 146. In addition, in one embodiment, the voltage limiting circuit 132 further comprises a first resistor 147, and a first capacitor 148 connected in series with the first resistor 147, wherein a first series node formed between the first resistor 147 and the first capacitor 148 is connected to the output terminal 140 of the comparator 136, and one end of the first resistor 147 not connected in series with the first capacitor 148 is connected to the operating voltage source 143. In another embodiment, the voltage limiting circuit 132 comprises a second resistor 150 connected to the negative electrode 142 of the diode 137.

Figure 4:
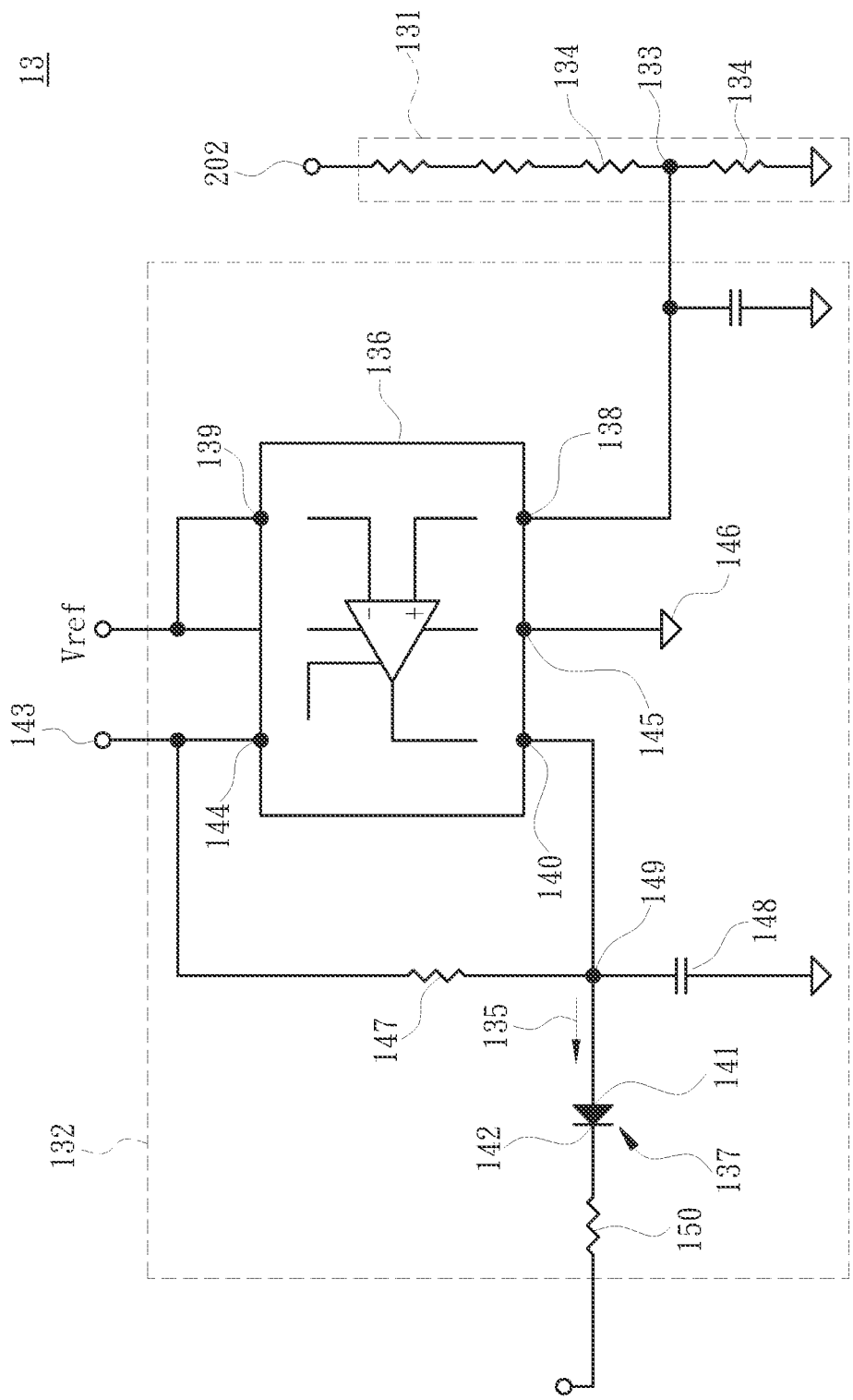
FIG. 4 is a circuit diagram of a second embodiment of the auxiliary voltage feedback unit of the invention.

The reference voltage (Vref) mentioned above can be generated by the comparator 136 directly as shown in FIG. 4, or can be generated as shown in FIG. 3. In the embodiment shown in FIG. 3, the voltage limiting circuit 132 comprises a reference voltage generating circuit 151 to generate the reference voltage (Vref). The reference voltage generating circuit 151 comprises a third resistor 152 connected to the operating voltage source 143, a three-terminal adjustable shunt reference source 154 connected in series with the third resistor 152, a voltage dividing bypass 155 connected in parallel with the three-terminal adjustable shunt reference source 154, and a second capacitor 156 connected in parallel with the three-terminal adjustable shunt reference source 154 and the voltage dividing bypass 155. A second series node 153 is formed between the third resistor 152 and the three-terminal adjustable shunt reference source 154. The voltage dividing bypass 155 comprises at least two voltage dividing resistors 157 and at least one bypass node 158 formed between the at least two voltage dividing resistors 157. In addition, the three-terminal adjustable shunt reference source 154 comprises a reference terminal 159 connected to the bypass node 158. In one embodiment, the three-terminal adjustable shunt reference source 154 is a TL431 electronic component sold on the market. In addition, a voltage value of the second series node 153 is defined as the reference voltage (Vref).

What is claimed is:

1. A control module of a power calibration circuit, comprising:
   a control unit, connected to at least one power switch of the power calibration circuit;
   a main voltage feedback unit, connected to an output terminal of the power calibration circuit and the control unit; and
   an auxiliary voltage feedback unit, connected to the output terminal of the power calibration circuit and the control unit, and the auxiliary voltage feedback unit comprising a voltage dividing circuit which is connected to the output terminal and includes at least one voltage dividing node, and a voltage limiting circuit which is connected to the at least one voltage dividing node and the control unit;
   wherein if a voltage of the at least one voltage dividing node is not higher than a reference voltage, the voltage limiting circuit is in a first state without interfering a feedback voltage provided from the main voltage feedback unit to the control unit, and if the voltage of the at least one voltage dividing node is higher than the reference voltage, the voltage limiting circuit is in a second state that interferes the feedback voltage provided from the main voltage feedback unit to the control unit with an interference voltage.

2. The control module of the power calibration circuit as claimed in claim 1, wherein the power calibration circuit is a bridge-type power calibration circuit.

3. The control module of the power calibration circuit as claimed in claim 1, wherein the power calibration circuit is a bridgeless-type power calibration circuit.

4. The control module of the power calibration circuit as claimed in claim 1, wherein the voltage limiting circuit comprises a comparator and a diode connected to the comparator, the comparator comprises a non-inverting input terminal connected to the at least one voltage dividing node, an inverting input terminal receiving the reference voltage, and an output terminal, the diode comprises a positive electrode connected to the output terminal of the comparator, and a negative electrode connected to the control unit.

5. The control module of the power calibration circuit as claimed in claim 4, wherein the power calibration circuit is a bridge-type power calibration circuit.

6. The control module of the power calibration circuit as claimed in claim 4, wherein the power calibration circuit is a bridgeless-type power calibration circuit.

7. The control module of the power calibration circuit as claimed in claim 4, wherein the voltage limiting circuit comprises a second resistor connected to the negative electrode of the diode.

8. The control module of the power calibration circuit as claimed in claim 4, wherein the reference voltage is generated by the comparator.

9. The control module of the power calibration circuit as claimed in claim 4, wherein the voltage limiting circuit comprises a first resistor and a first capacitor connected in series with the first resistor, a first series node formed between the first resistor and the first capacitor is connected to the output terminal of the comparator, and one end of the first resistor not connected in series with the first capacitor is connected to an operating voltage source.

10. The control module of the power calibration circuit as claimed in claim 9, wherein the power calibration circuit is a bridge-type power calibration circuit.

11. The control module of the power calibration circuit as claimed in claim 9, wherein the power calibration circuit is a bridgeless-type power calibration circuit.

12. The control module of the power calibration circuit as claimed in claim 9, wherein the voltage limiting circuit comprises a second resistor connected to the negative electrode of the diode.

13. The control module of the power calibration circuit as claimed in claim 4, wherein the voltage limiting circuit comprises a reference voltage generating circuit to generate the reference voltage, the reference voltage generating circuit comprises a third resistor connected to an operating voltage source, a three-terminal adjustable shunt reference source connected in series with the third resistor to form a second series node therebetween, a voltage dividing bypass connected in parallel with the three-terminal adjustable shunt reference source, and a second capacitor connected in parallel with the three-terminal adjustable shunt reference source and the voltage dividing bypass, the voltage dividing bypass comprises at least two divider resistors and at least one bypass node formed between the divider resistors, the three-terminal adjustable shunt reference source comprises a reference terminal connected to the at least one bypass node, and a voltage value of the second series node is defined as the reference voltage.

14. The control module of the power calibration circuit as claimed in claim 13, wherein the power calibration circuit is a bridge-type power calibration circuit.

15. The control module of the power calibration circuit as claimed in claim 13, wherein the power calibration circuit is a bridgeless-type power calibration circuit.

* * * * *